United States Patent
Ruby et al.

[11] Patent Number: 5,871,591
[45] Date of Patent: Feb. 16, 1999

[54] SILICON SOLAR CELLS MADE BY A SELF-ALIGNED, SELECTIVE-EMITTER, PLASMA-ETCHBACK PROCESS

[75] Inventors: Douglas S. Ruby; William K. Schubert; James M. Gee, all of Albuquerque, N. Mex.

[73] Assignee: Sandia Corporation, Albuquerque, N. Mex.

[21] Appl. No.: 742,378

[22] Filed: Nov. 1, 1996

[51] Int. Cl.[6] .................................................. H01L 31/00
[52] U.S. Cl. ........................ 136/261; 136/255; 136/256
[58] Field of Search .................................. 136/261, 255, 136/256

[56] References Cited

U.S. PATENT DOCUMENTS 4,158,591  6/1979  Avery et al. ............................. 136/256

OTHER PUBLICATIONS

Z. Chen, P. Sana, J. Salami, and A. Rohatgi, "A Novel and Effective PECVD SiO2/SiN Antireflection Coating for Si Solar Cells," IEEE Trans. Elect. Dev., 40, Jun. 1993, pp. 1161–1165.

N. Mardesich, "Solar Cell Efficiency Enchancement by Junction Etching and Conductive AR Coating Processes," Proc. 15th PVSC, May 1981, pp. 446–449.

S. R. Wenham, M. R. Willison, S. Narayanan, and M. A. Green, "Efficiency Improvement in Screen–Printed Polycrystalline Silicon Solar Cells by Plasma Treatments," Proc. 18th PVSC, Oct. 1985, pp. 1008–1013.

D. S. Ruby, W. L. Wilbanks, C. B. Fleddermann, and J. I. Hanoka, "The Effect of Hydrogen Plasma and PECVD–Nitride Deposition of Bulk and Surface passivation in String–Ribbon Silicon Solar Cells." Presented at the 13th European Potovoltaic Solar Energy Conference, Nice, France, Oct. 1995.

D. S. Ruby, C. B. Fleddermann, M. Roy and S. Narayannan, "Self–Aligned Selective Emitter Plasma–Etchback and Passivation Process for Screen–Printed Silicon Solar Cells", Proc. 6th PVSC, Aug. 12–14, 1996.

*Primary Examiner*—Mark Chapman

[57] ABSTRACT

A potentially low-cost process for forming and passivating a selective emitter. The process uses a plasma etch of the heavily doped emitter to improve its performance. The grids of the solar cell are used to mask the plasma etch so that only the emitter in the region between the grids is etched, while the region beneath the grids remains heavily doped for low contact resistance. This process is potentially low-cost because it requires no alignment. After the emitter etch, a silicon nitride layer is deposited by plasma-enhanced, chemical vapor deposition, and the solar cell is annealed in a forming gas.

44 Claims, 2 Drawing Sheets

SILICON SOLAR CELLS MADE BY A SELF-ALIGNED, SELECTIVE-EMITTER, PLASMA-ETCHBACK PROCESS

This invention was made with Government support under Contract No. DE-AC04-94AL85000 awarded by the United States Department of Energy. The Government has certain rights in the invention.

BACKGROUND OF THE INVENTION

Plasma-enhanced chemical vapor deposition, used in the manufacture of silicon solar cells, is recognized as a potentially cost-effective, performance-enhancing technique that can provide simultaneous surface passivation and an effective anti-reflection coating. To gain the full benefit from improved emitter-surface passivation on cell performance, it is necessary to tailor the emitter doping profile so that the emitter is lightly doped between the gridlines, but heavily doped beneath them. This is especially true for screen-printed gridlines which require very heavy doping beneath the grid for acceptably low contact resistance. This selectively patterned emitter doping profile (selective emitter) has historically been obtained by using expensive photolithographic or screen-printed alignment techniques and multiple high-temperature diffusion steps.

SUMMARY OF THE INVENTION

Glossary

ARC: anti-reflection coating; applied to the front surface of a solar cell to reduce the optical reflectance, and thereby enhance the absorption, of the cell emitter: region on front surface of a solar cell which collects electron-hole pairs generated by absorption of light FF: fill factor FGA: forming-gas anneal (high-temperature anneal in a gas consisting of about 5% molecular hydrogen)

grid: metallic collector of current from surface of a solar cell

H: atomic hydrogen

IQE: internal quantum efficiency (ratio of electron-hole pairs collected to number of incident photons absorbed)

$I_{SC}$: short-circuit current

LBIC: laser-beam induced current (current produced by scanning a laser beam across a substrate)

PECVD: plasma-enhanced chemical vapor deposition $R_S$: series resistance

RIE: reactive-ion etching; chemical etching using plasma-generated reactive species, and which uses ion bombardment from the plasma to aid in the etching $V_{OC}$: open-circuit voltage In the present invention, a potentially low-cost process for forming and passivating a selective emitter is described. The process uses a plasma etch of the heavily doped emitter to improve its performance. The grids of the solar cell are used to mask the plasma etch so that only the emitter in the region between the grids is etched, while the region beneath the grids remains heavily doped for low contact resistance. This process is potentially low-cost because it requires no alignment. After the emitter etch, a silicon nitride (nitride) layer is deposited by PECVD and the solar cell is annealed in a forming gas. The PECVD nitride layer passivates the surface and provides an ARC. The deposit can also provide passivation of bulk defects through an in-situ plasma hydrogenation. The plasma etch and nitride deposition can be performed in the same chamber to reduce cost further.

The difference between the present invention and a standard method of fabrication is illustrated by delineating the process steps. Persons familiar with the art will recognize there are several methods of performing some of the steps, and that the order of some of the steps may be changed.

A standard, prior-art, silicon solar-cell fabrication sequence using screen-printed grids consists of the following process steps 1–7:

Process Steps 1. cleaning of the silicon substrate, including removal of a top surface region by chemical etching;
2. diffusing phosphorus into the top surface to form the emitter to a sheet resistance of about 40 ohm/square;
3. stacking multiple cells concentrically and plasma etching the edges in a single operation to remove emitter material extraneously formed at the edges;
4. chemically etching the emitter surface to remove diffusion oxides formed therein;
5. applying silver paste to the emitter (top surface) through a grid-pattern screen, and drying and firing the paste to form a metallized grid;
6. applying silver paste to the bottom surface through an electrical contact-pattern screen, and drying and firing the paste to form a metallized electrical contact; and
7. depositing an ARC.

In the present invention step 7 is replaced by:

7a. plasma hydrogenating the substrate (optional);
7b. plasma etching the emitter; RIE being one such method of plasma etching; and
7c. plasma depositing a silicon nitride ARC.
7d. Annealing in forming gas.

If the rear (bottom) surface electrical-contact metallization is performed by a low-temperature process (under approximately 400° C.), instead of the relatively high-temperature paste process of step 6, then the bottom metallization may be performed after step 7c or 7d, as well as in the sequence given above.

In addition, the emitter etchback (step 7b) may be performed before the optional plasma hydrogenation (step 7a). Because the plasma-hydrogenation step may damage the surface, it is advantageous to deposit a thin PECVD-nitride film on the emitter surface immediately after the etchback and prior to the plasma-hydrogenation step to protect the surface. In this case, the remainder of the PECVD-nitride film needed for ARC purposes would then be deposited after the plasma-hydrogenation step.

BRIEF DESCRIPTION OF THE DRAWINGS

The accompanying drawings, which are incorporated in, and form part of, the specification, illustrate embodiments of the present invention and, together with the description, serve to explain the principles of the invention.

DETAILED DESCRIPTION OF THE INVENTION

Figure 1A:
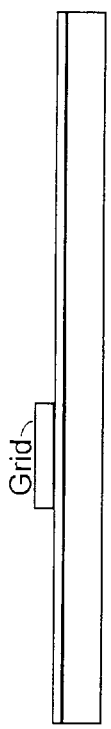
FIG. 1A: Phosphorus ($n^{++}$) heavily diffused into the silicon substrate.

Selected, principal process stages of the present invention are illustrated in FIGS. 1A–1D as follows:

1. FIG. 1A (process step 2): Phosphorus is heavily diffused into the top surface of the silicon to form a highly doped emitter region, denoted as $n^{++}$. This heavy doping results in the migration of deleterious impurities to the emitter surface (gettering) which improves the carrier diffusion lengths in the bulk of the silicon substrate.

Figure 1B:
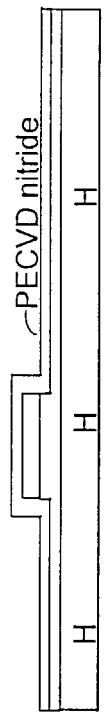
FIG. 1B: Grid applied by silver-paste metallization.

2. FIG. 1B (process step 5): The front metal gridlines are applied by the standard technique of screen-printing with silver paste, after which the paste is fired providing a lower contact resistance to the emitter because of the emitter's extra heavy doping.

Figure 1C:
FIG. 1C: Emitter plasma etched with silicon masked by grid resulting in lightly doped emitter region $n^+$.

3. FIG. 1C (process step 7b): (Note: before this step, the wafer may be plasma hydrogenated (process step 7a) to inject atomic hydrogen (H) into the bulk of the substrate which further improves bulk diffusion lengths. Plasma hydrogenation beneficially reduces the contact resistance of the gridlines to the emitter.) The emitter is plasma etched (emitter etchback) which preferentially removes silicon from between the gridlines leaving the gridlines and the silicon underlying the gridlines unaffected. This etching removes the most heavily doped portion of the emitter, along with any impurities which have been gettered to the emitter surface, and any damage done to the surface by the optional plasma hydrogenation. Since the gridlines serve as the mask for the etching process, the technique provides automatic alignment of the heavily doped region with the metal gridlines. Heavily doped regions remain only under the gridlines where lower contact resistance and lower contact recombination properties are desired, and the more lightly doped regions ($n^+$) between the gridlines exhibit reduced emitter recombination and are amenable to surface passivation. Because the process is self-aligning, it is simple and low in cost.

Figure 1D:
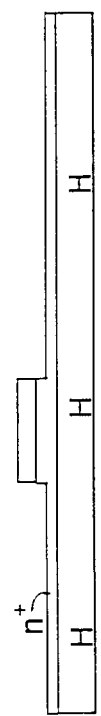
FIG. 1D: PECVD nitride applied for surface passivation and ARC.

4. FIG. 1D (process step 7c): A PECVD-nitride film is applied to the emitter surface which provides effective surface passivation to the less-heavily doped areas of the emitter between the gridlines, thereby improving current collection by the solar cell. This nitride layer also serves as an ARC, and replaces the ARC applied to cells (step 7) in the standard fabrication sequence. If the deposited nitride were to be applied in the same plasma reactor as was used for the optional plasma hydrogenation and plasma etching, significant simplification and cost savings could be realized.

Application of the present invention is illustrated by the following experimental demonstration which also reveals many of the performance advantages of the invention. Solar cells were made with cast multicrystalline silicon, and were treated with standard production line processing as previously described through the printing and firing of the gridlines. The cells then underwent a particular type of plasma etching (RIE) for 3 minutes to increase the sheet resistance of the emitters to about 80–100 ohm/square. The cells were plasma etched in a Technics PE II-A reactor at a power of 10 W, with pure $SF_6$ at a pressure of 100 mTorr. This was followed by either ammonia plasma hydrogenation (H-passivation), which provides atomic hydrogen for passivation of bulk defects, or a silicon nitride PECVD; these processes were found to be effective for both bulk and surface passivation in previous experiments with multicrystalline Si.

The ammonia-plasma hydrogenations and plasma-nitride depositions were performed with a modified Pacific Western Coyote PECVD, RF parallel-plate reactor operating at 13.56 MHz, with large batch-size and high-throughput potential. Reaction gases for the PECVD silicon nitride deposition were a 3% mixture of silane in nitrogen and pure ammonia. The cells were then returned to the production line for final cell processing.

Four processing sequences, shown in the Table, were applied to twelve 102.6-$cm^2$ multicrystalline silicon cells using matched material from the same ingot, and in most cases with the same grain structure. Both $TiO_2$ and PECVD-nitride ARCs are included.

TABLE

| Efficiency % | $I_{SC}$ amp | $V_{OC}$ millivolt | FF % | $R_S$ milliohm |
|---|---|---|---|---|
| Group 1. Control cells: No emitter etchback, $TiO_2$ ARC | | | | |
| 12.6 ± 0.1 | 2.91 ± 0.02 | 586 ± 1 | 75.5 ± 0.7 | 9.2 ± 0.5 |
| Group 2. Plasma emitter etchback (RIE), $TiO_2$ ARC | | | | |
| 12.2 ± 0.1 | 2.93 ± 0.02 | 580 ± 1 | 73.4 ± 0.4 | 15.0 ± 1.0 |
| Group 3. Plasma emitter etchback (RIE), H passivation, $TiO_2$ ARC | | | | |
| 12.8 ± 0.3 | 2.97 ± 0.02 | 585 ± 1 | 75.4 ± 1.5 | 10.7 ± 0.5 |
| Group 4. Plasma emitter etchback (RIE), PECVD-nitride ARC, FGA | | | | |
| 13.0 ± 0.1 | 3.00 ± 0.01 | 587 ± 1 | 75.3 ± 0.2 | 10.7 ± 0.5 |

The cells from Group 2 suffered an efficiency loss due primarily to loss of $V_{OC}$, as expected, since the etchbacked emitter is now transparent to minority carriers which now recombine at the unpassivated front surface. An additional loss in FF is due to the increase in series resistance because of the extra sheet resistance of the etchbacked emitter. In an optimized sequence, the cells would have more closely spaced gridlines to compensate for this. In addition, an extra-heavy emitter doping could be performed, possibly resulting in additional gettering of bulk impurities which could then be etched away. Also, heavier doping under the gridlines would better isolate them and reduce contact recombination. Finally, the heavier doping would also reduce the contact resistance that often limits screen-printed cell performance. The lack of current loss in these cells indicates that any increase in surface recombination is compensated for by reduced emitter recombination in the now lightly doped emitter.

The Group 3 cells have regained most of the $V_{OC}$ loss, probably due to the compensating effect of reduced bulk recombination from the hydrogenation treatment. This is accompanied by a reduction in the series resistance, attributable to a decrease in the contact resistance of the screen-printed gridlines. This, in combination with the benefits of heavier emitter doping mentioned above, would address many of the shortcomings associated with the screen-printing process.

The cells from Group 4 have totally regained their initial $V_{OC}$ values and show a significant 3% gain in $I_{SC}$ now that the surface of the transparent emitter is passivated by the nitride film. The effect of the plasma-nitride deposition on reducing the gridline contact resistance is still apparent, resulting in an overall average increase in efficiency of almost half an absolute efficiency percentage point. Even better results are to be expected when the nitride passivation is combined with bulk hydrogenation and the benefits of heavy emitter doping. The FGA "activates" the PECVD-nitride layer; and is a necessary part of the PECVD-nitride process.

In summary, a statistically significant improvement of about half an absolute percentage point in cell efficiency is observed for the cells using the process of the present invention, viz., self-aligned emitter etchback, followed by PECVD-nitride surface passivation and forming gas anneal (Group 4 of the Table), compared with the control cells used in a prior-art process (Group 1). Additional improvement may be expected if bulk passivation is included in the process either before the etchback, or after the etchback if the emitter surface is protected by a thin PECVD-nitride layer.

Figure 2:
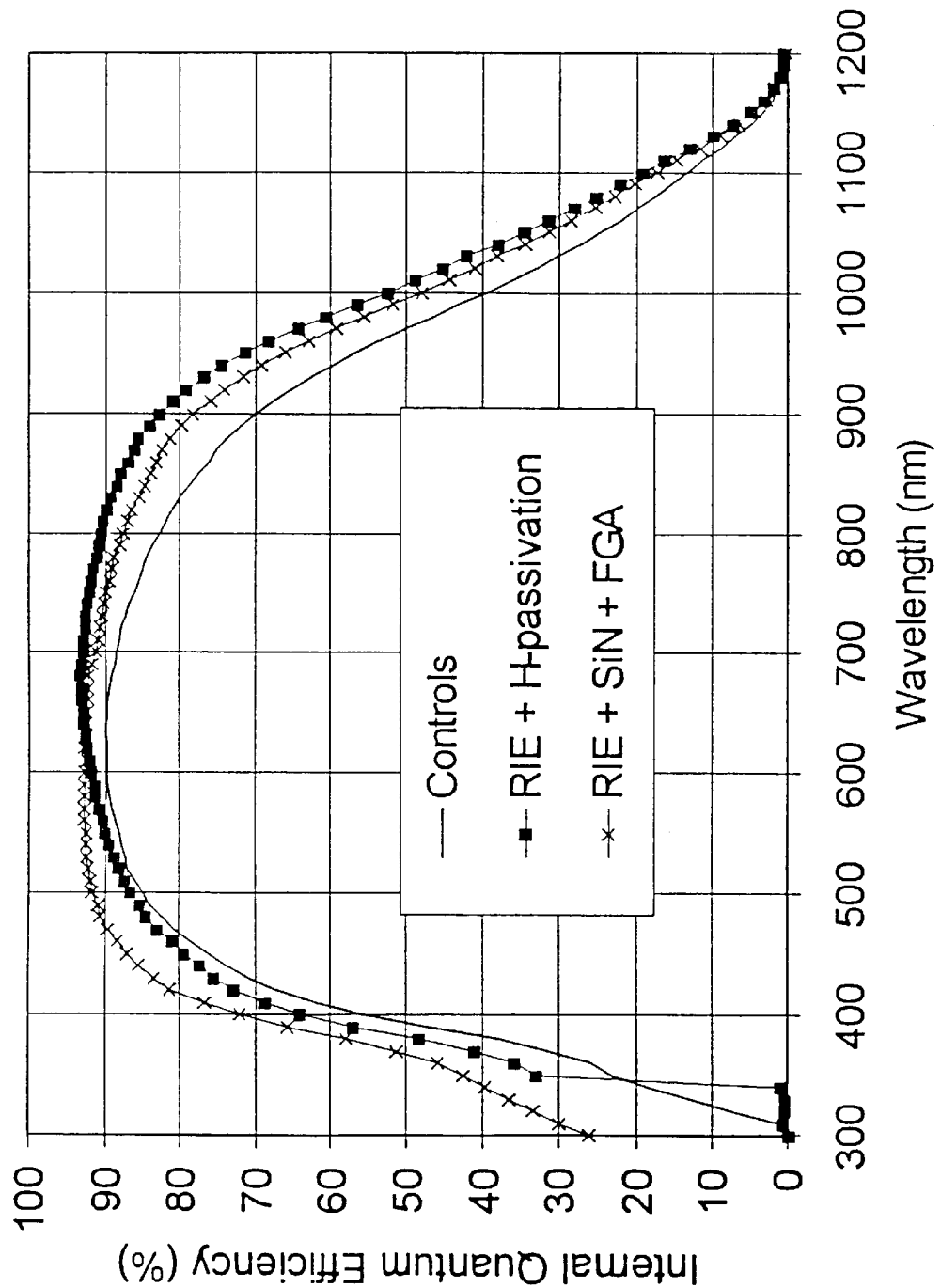
FIG. 2: IQE curves of three solar cells representative of Groups 1, 3, and 4 described in the Table.

Additional information about the process of the present invention may be gained from the IQE curves. Such curves of typical cells from Groups 1, 3, and 4 are shown in FIG. 2. LBIC scans showed that the cells from Group 2 did not have the same grain structure as the others, and therefore it was not possible to find the same "median" grain from cells of Group 2 on which to measure the IQE.

The IQE curves (FIG. 2) show that while both plasma treatments (ammonia plasma hydrogenation and PECVD nitride) increased the red response relative to the control cell, the ammonia-plasma hydrogenation had the greater effect. It is also clear that the PECVD nitride ARC resulted in the best blue response due to its better passivation of the emitter surface. In fact, the IQE(400-nm) value (73%) is almost as high as that obtained previously on this material (78%) with a nitride coating optimized for low surface recombination. This shows that the RIE process may not have damaged the emitter surface significantly, if at all.

It has been determined, therefore, that RIE is compatible with the use of standard, commercial, screen-printed gridlines as etch masks to form self-aligned, selectively doped emitter profiles. This process results in reduced gridline contact resistance, an undamaged emitter surface easily passivated by plasma-nitride, and a less heavily doped emitter between gridlines for reduced emitter recombination. It allows for heavier doping beneath the gridlines for even lower contact resistance, reduced contact recombination, and better bulk defect gettering. Heavier emitter doping, as well as bulk hydrogenation before the RIE step, so that surface damage from the bulk passivation step can be removed or reduced, are likely to be beneficial. Likewise, all three plasma processes—bulk passivation (plasma hydrogenation), emitter etchback, and PECVD nitride surface passivation—may be expected to have a synergistic additive effect.

The examples discussed above are cited to illustrate a particular embodiment of this invention. It is contemplated that the use of the invention may involve components having different sizes, shapes, and compositions as long as the principle of using plasma-etching techniques in conjunction with standard screen-printed gridlines as etch masks to form self-aligned, selectively doped emitter profiles for silicon solar cells is followed. It is intended that the scope of the invention be defined by the claims appended hereto.

What is claimed is:

1. A process for forming and passivating a solar cell selective emitter in a silicon wafer comprising:
   cleaning the silicon substrate, including removing a top surface region by chemical etching;
   diffusing phosphorus into a top surface of the wafer to form the emitter therein with a suitable sheet electrical resistance;
   plasma etching the edge of the wafer to remove extraneous emitter material formed on the edge of the wafer;
   chemically etching the emitter to remove diffusion oxides formed in the emitter;
   metallizing a patterned grid onto the top surface emitter;
   metallizing a patterned electrical contact onto the bottom surface of the wafer;
   plasma etching the emitter, the grid formed thereon masking the substrate below it so that emitter material not so masked is selectively removed;
   plasma depositing a silicon nitride anti-reflection coating onto the top surface; and
   annealing in a forming gas.

2. The process of claim 1 wherein metallizing a patterned grid onto the top surface emitter comprises applying silver paste to the emitter through a grid-pattern screen and drying and firing the paste.

3. The process of claim 1 wherein metallizing a patterned electrical contact onto the bottom surface comprises applying silver paste to the bottom surface through an electrical contact-pattern screen and drying and firing the paste.

4. The process of claim 1 wherein a suitable sheet electrical resistance is about 40 ohm/square.

5. The process of claim 1 wherein the silicon nitride anti-reflection coating is about 60–90 nm thick.

6. The process of claim 1 wherein the forming gas anneal is done with a gas containing about 5–100% molecular hydrogen for about 20–30 minutes at a temperature of about 300°–400° C.

7. A solar cell produced by the process of claim 1.

8. The process of claim 1 wherein plasma hydrogenating the silicon substrate is interposed between metallizing a patterned electrical contact onto the bottom surface and plasma etching the emitter.

9. The process of claim 8 wherein metallizing a patterned grid onto the top surface emitter comprises applying silver paste to the emitter through a grid-pattern screen and drying and firing the paste.

10. The process of claim 8 wherein metallizing a patterned electrical contact onto the bottom surface comprises applying silver paste to the bottom surface through an electrical contact-pattern screen and drying and firing the paste.

11. The process of claim 8 wherein a suitable sheet electrical resistance is about 40 ohm/square.

12. The process of claim 8 wherein the silicon nitride anti-reflection coating is about 60–90 nm thick.

13. The process of claim 8 wherein the forming gas anneal is done with a gas containing about 5–100% molecular hydrogen for about 20–30 minutes at a temperature of about 300°–400° C.

14. A solar cell produced by the process of claim 8.

15. A process for forming and passivating a solar cell selective emitter in a silicon wafer comprising:
   cleaning the silicon substrate, including removing a top surface region by chemical etching;
   diffusing phosphorus into a top surface of the wafer to form the emitter therein with a suitable sheet electrical resistance;
   plasma etching the edge of the wafer to remove extraneous emitter material formed on the edge of the wafer;
   chemically etching the emitter to remove diffusion oxides formed in the emitter;
   metallizing a patterned grid onto the top surface emitter;
   plasma etching the emitter, the grid formed thereon masking the substrate below it so that emitter material not so masked is selectively removed;
   plasma depositing a silicon nitride anti-reflection coating onto the top surface;
   annealing in forming gas; and
   metallizing a patterned electrical contact onto the bottom surface.

16. The process of claim 15 wherein metallizing a patterned grid onto the top surface emitter comprises applying silver paste to the emitter through a grid-pattern screen and drying and firing the paste.

17. The process of claim 15 wherein metallization of a patterned electrical contact onto the bottom surface is done by a process below about 400° C.

18. The process of claim 15 wherein a suitable sheet electrical resistance is about 40 ohm/square.

19. The process of claim 15 wherein the silicon nitride anti-reflection coating is about 60–90 nm thick.

20. The process of claim 15 wherein the forming gas anneal is done with a gas containing about 5–100% molecular hydrogen for about 20–30 minutes at a temperature of about 300°–400° C.

21. A solar cell produced by the process of claim 15.

22. The process of claim 15 wherein plasma hydrogenating the silicon substrate is interposed between metallizing a patterned grid onto the top surface emitter and plasma etching the emitter.

23. The process of claim 22 wherein metallizing a patterned grid onto the top surface emitter comprises applying silver paste to the emitter through a grid-pattern screen and drying and firing the paste.

24. The process of claim 22 wherein metallization of a patterned electrical contact onto the bottom surface is done by a process below about 400° C.

25. The process of claim 22 wherein a suitable sheet electrical resistance is about 40 ohm/square.

26. The process of claim 22 wherein the silicon nitride anti-reflection coating is about 60–90 nm thick.

27. The process of claim 22 wherein the forming gas anneal is done with a gas containing about 5–100% molecular hydrogen for about 20–30 minutes at a temperature of about 300°–400° C.

28. A solar cell produced by the process of claim 22.

29. A process for forming and passivating a solar cell selective emitter in a silicon wafer comprising:

cleaning the silicon substrate, including removing a top surface region by chemical etching;

diffusing phosphorus into a top surface of the wafer to form the emitter therein with a suitable sheet electrical resistance;

plasma etching the edge of the wafer to remove extraneous emitter material formed on the edge of the wafer;

chemically etching the emitter to remove diffusion oxides formed in the emitter;

metallizing a patterned grid onto the top surface emitter;

metallizing a patterned electrical contact onto the bottom surface;

plasma etching the emitter, with the grid formed thereon masking the substrate below it;

plasma depositing a thin silicon nitride coating onto the top surface;

plasma hydrogenating the silicon substrate;

plasma depositing a thick silicon nitride anti-reflection coating onto the top surface; and annealing in a forming gas.

30. The process of claim 28 wherein metallizing a patterned grid onto the top surface emitter comprises applying silver paste to the emitter through a grid-pattern screen and drying and firing the paste.

31. The process of claim 28 wherein metallizing a patterned electrical contact onto the bottom surface comprises applying silver paste to the bottom surface through an electrical contact-pattern screen and drying and firing the paste.

32. The process of claim 28 wherein a suitable sheet electrical resistance is about 40 ohm/square.

33. The process of claim 28 wherein the thin silicon nitride coating is about 10 nm thick.

34. The process of claim 28 wherein the thick silicon nitride anti-reflection coating is about 50–80 nm thick.

35. The process of claim 28 wherein the forming gas anneal is done with a gas containing about 5–100% molecular hydrogen for about 20–30 minutes at a temperature of about 300°–400° C.

36. A solar cell produced by the process of claim 28.

37. A process for forming and passivating a solar cell selective emitter in a silicon wafer comprising:

cleaning the silicon substrate, including removing a top surface region by chemical etching;

diffusing phosphorus into a top surface of the wafer to form the emitter therein with a suitable sheet electrical resistance;

plasma etching the edge of the wafer to remove extraneous emitter material formed on the edge of the wafer;

chemically etching the emitter to remove diffusion oxides formed in the emitter;

metallizing a patterned grid onto the top surface emitter;

plasma etching the emitter, with the grid formed thereon masking the substrate below it;

plasma depositing a thin silicon nitride coating onto the top surface;

plasma hydrogenating the silicon substrate;

plasma depositing a thick silicon nitride anti-reflection coating onto the top surface;

annealing in forming gas; and metallizing a patterned electrical contact onto the bottom surface.

38. The process of claim 37 wherein metallizing a patterned grid onto the top surface emitter comprises applying silver paste to the emitter through a grid-pattern screen and drying and firing the paste.

39. The process of claim 37 wherein metallization of a patterned electrical contact onto the bottom surface is done by a process below about 400° C.

40. The process of claim 37 wherein a suitable sheet electrical resistance is about 40 ohm/square.

41. The process of claim 37 wherein the thin silicon nitride coating is about 10 nm thick.

42. The process of claim 37 wherein the thick silicon nitride anti-reflection coating is about 50–80 nm thick.

43. The process of claim 37 wherein the forming gas anneal is done with a gas containing about 5–100% molecular hydrogen for about 20–30 minutes at a temperature of about 300°–400° C.

44. A solar cell produced by the process of claim 37.

* * * * *